(12) United States Patent
Goldbach et al.

(10) Patent No.: US 7,863,136 B2
(45) Date of Patent: Jan. 4, 2011

(54) METHOD OF MANUFACTURING INTEGRATED CIRCUITS INCLUDING A FET WITH A GATE SPACER AND A FIN

(75) Inventors: Matthias Goldbach, Dresden (DE); Jessica Hartwich, Dresden (DE); Lars Dreeskornfeld, Munich (DE); Arnd Scholz, Dresden (DE); Tobias Mono, Dresden (DE)

(73) Assignee: Qimonda AG, Munich (DE)

( * ) Notice: Subject to any disclaimer, the term of this patent is extended or adjusted under 35 U.S.C. 154(b) by 64 days.

(21) Appl. No.: 12/242,039

(22) Filed: Sep. 30, 2008

(65) Prior Publication Data
US 2010/0078711 A1    Apr. 1, 2010

(51) Int. Cl.
*H01L 21/336*    (2006.01)
(52) U.S. Cl. .............. 438/270; 438/272; 438/424; 257/328; 257/E29.262
(58) Field of Classification Search ............ None
See application file for complete search history.

(56) References Cited

U.S. PATENT DOCUMENTS

| | | | |
|---|---|---|---|
| 6,413,802 B1 | 7/2002 | Hu et al. | |
| 6,962,843 B2 * | 11/2005 | Anderson et al. | 438/212 |
| 7,074,662 B2 * | 7/2006 | Lee et al. | 438/199 |
| 7,211,864 B2 * | 5/2007 | Seliskar | 257/347 |
| 7,626,230 B2 * | 12/2009 | Joo et al. | 257/330 |
| 7,692,254 B2 * | 4/2010 | Anderson et al. | 257/401 |
| 2005/0199920 A1 * | 9/2005 | Lee et al. | 257/288 |
| 2006/0057802 A1 * | 3/2006 | Nowak et al. | 438/206 |
| 2007/0026629 A1 * | 2/2007 | Chen et al. | 438/424 |

* cited by examiner

*Primary Examiner*—Thanh V Pham
*Assistant Examiner*—Andres Munoz
(74) *Attorney, Agent, or Firm*—Dicke, Billig & Czaja, PLLC

(57) ABSTRACT

A method of manufacturing integrated circuits including a FET with a gate spacer. One embodiment provides forming a lamella of a semiconductor material and two insulator structures on opposing sides of the lamella. The lamella is recessed. A fin is formed from a central portion of the lamella. The fin is thinner than a first and a second portion of the lamella which face each other on opposing sides of the fin. A first spacer structure is formed which encompasses a first portion of the fin, the first portion adjoining to the first lamella portion. A gate electrode is disposed adjacent to the first spacer structure and encompasses a further portion of the fin on a top side and on two opposing lateral sides.

15 Claims, 17 Drawing Sheets

METHOD OF MANUFACTURING INTEGRATED CIRCUITS INCLUDING A FET WITH A GATE SPACER AND A FIN

BACKGROUND

Integrated circuits include field effect transistors (FETs) of different types, which are optimized in view of different requirements, for example, switching speed, on-resistance, threshold voltage conformity, leakage current and switching power. Some types of FETs are based on a 3D-channel. In the conductive state of a 3D-channel FET, a conductive inversion layer (channel) extends along more than one plane. Examples of 3D-channel FETs are FinFETs, EUDs (enhanced U-groove devices), RCATs (recess channel array transistors), and S-RCATs (sphere-shaped recess channel array transistors).

Shrinking down FETs in size, the off-state leakage current becomes a device characteristic of increasing relevance with regard to low-power and stand-by applications. One challenge for 3D-channel FETs is the gate induced drain leakage in the transistor off-state. An electrical field which is effective in the region of one of the pn-junctions between the respective source/drain region and the channel region may bend up the energy band for valence band electrons near the interface between the semiconductor substrate and the gate electrode such that electrons may tunnel from the valence band into the conduction band and may induce a leakage current that flows between the respective source/drain region and a semiconductor bulk above or in which a semiconductor body of the FET is formed.

A need exists for a method integrating the formation of different types of FETs including 3D-channel FETs and improving the FET characteristics, for example, ensuring a low gate induced drain leakage in 3D-channel FETs.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides an integrated circuit as described herein that includes a FET with a first and a second impurity region of a first conductivity type formed below a main surface in a semiconductor substrate and a third impurity region of a second, different conductivity type formed in a buried semiconductor fin which extends between the first and the second impurity regions. A U-shaped first insulator structure encloses a first portion of the buried semiconductor fin that directly adjoins the first impurity region. A pn-junction between the first and third impurity regions may be formed below the U-shaped first insulator structure, which may uniformly reduce an electric field strength between a gate electrode and a source/drain region and which may facilitate reduction of a gate induced leakage current.

One embodiment provides a method of manufacturing an integrated circuit that provides a field effect transistor with a fin. A first and a second substrate portion face each other on opposing first sides of the fin. A first spacer structure is formed which encompasses a first portion of the fin directly adjoining to the first substrate portion. A gate electrode is formed adjacent to the first spacer structure. The gate electrode encompasses a further portion of the fin. The first spacer structure may be formed with high uniformity along its longitudinal axis, wherein device performance may be improved.

Figure 1A:
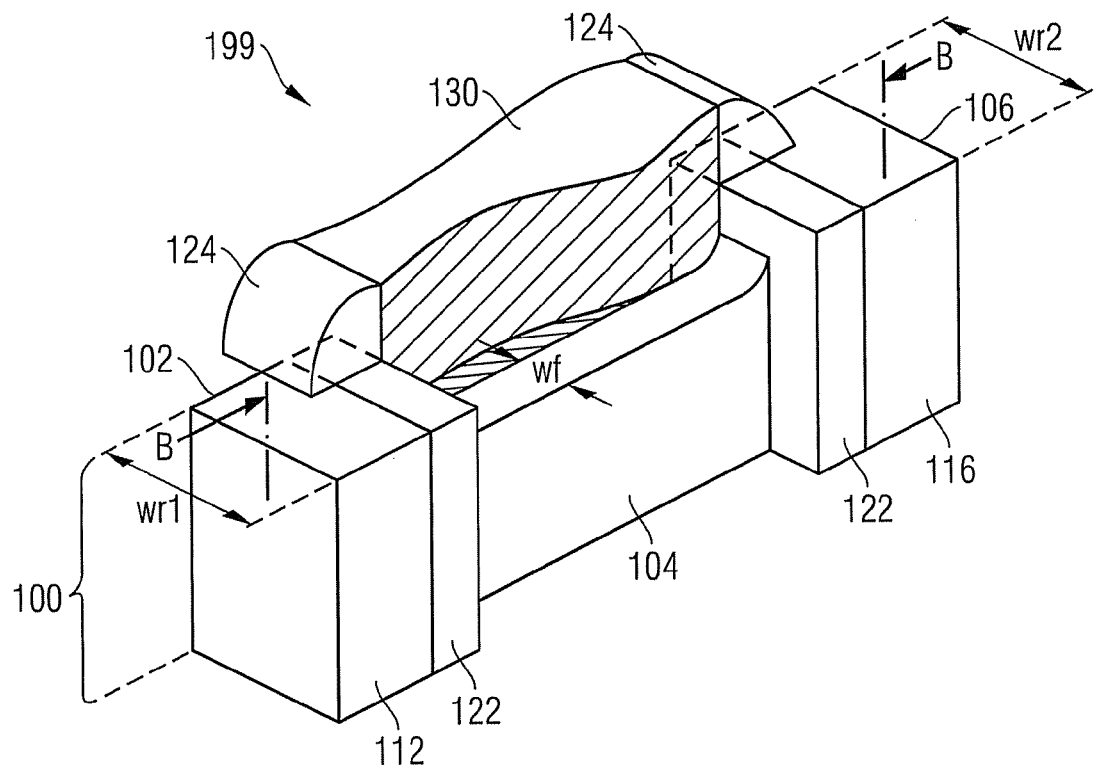
FIG. 1A illustrates a schematic perspective view of an integrated circuit including a 3D-channel n-FET with recessed fin according to one embodiment.

FIG. 1A illustrates an integrated circuit including a 3D-channel FET 199 according to one embodiment. A portion of a semiconductor substrate 100 forms a lamella that includes a semiconductor body of the FET 199. The substrate 100 may be a preprocessed single crystalline silicon wafer or a silicon-on-insulator (SoI) wafer and may include further doped and undoped portions, epitaxial semiconductor layers, as well as further conductive and insulating structures that have previously been fabricated. The semiconductor body of the FET 199 includes a first and a second impurity region 112, 116 of a first conductivity type, which may be formed in a first and a second lamella portion 102, 106 respectively. The lamella includes further a buried semiconductor fin 104 that is formed from a central lamella portion, which includes a third impurity region 114 of a second, different conductivity type, and which extends between the first and second lamella portions 102, 106 with the first and the second impurity regions 112, 116. The first and second lamella portions 102, 106 face each other on opposing first sides of the fin 104. A width wf of the fin 104 is defined perpendicular to a direction defined by the direct connection line between the first and the second impurity regions 112, 116 and is narrower than the widths wr1, wr2 of the first and second lamella portions 102, 106. An upper edge of the fin 104 may be formed below the upper edges of the first and second lamella portions 102, 106. The third impurity region 114 may be connected to a voltage source supplying a constant voltage.

Two U-shaped first spacer structures 122 adjoin the first and second lamella portions 102, 106 on the fin side and bear on end portions of the fin 104 such that each first spacer structure 122 adjoins to one of the first and second lamella portions 102, 106 and encompasses a first portion of the fin 104 on its top side and on two opposing second sides of the fin 104. Portions of each first insulator structure 122 face each other directly at the fin 104 on the second sides with the fin 104 in-between. A gate electrode 130 extends between the two first spacer structures 122 and encompasses a further portion of the fin 104 between the two first spacer structures 122 on its top side and on the two opposing second sides. A portion of the gate electrode 130 is disposed above an upper edge of the fin 104. The gate electrode 130 may protrude above the upper edges of the first and second lamella portions 102, 106. Second spacer structures 124 may extend along the sidewalls of protruding portions of the gate electrode 130 which protrude above the upper edges of the first and second lamella portions 102, 106. Those edges of the second and the first spacer structures 124, 122, which are orientated to the gate electrode 130, may be approximately flush to each other.

Figure 1B:
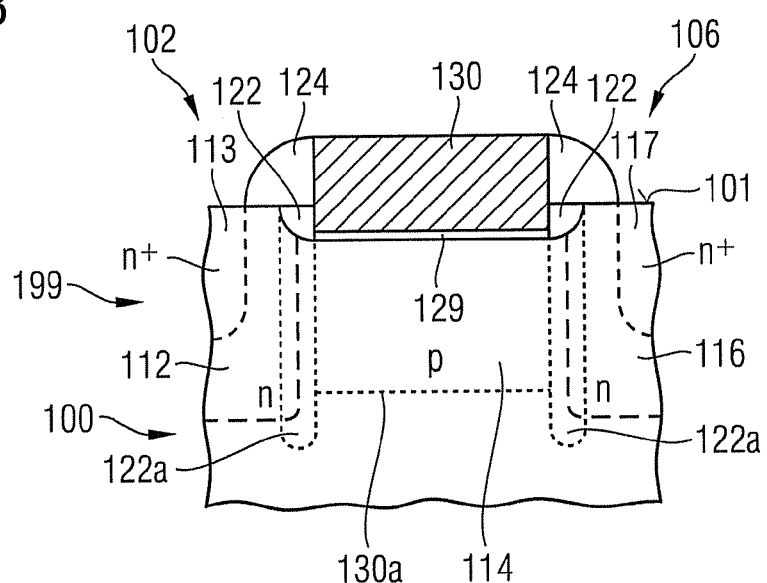
FIG. 1B illustrates a schematic cross-sectional view along line B-B of FIG. 1A.

According to FIG. 1B, which is a cross-sectional view of the FET 199 along line B-B of FIG. 1A, the third impurity region 114, which is formed in the buried semiconductor fin 104, extends between the first and the second impurity regions 112, 116. An upper edge of the buried semiconductor fin 104 is formed below a main surface 101 of the substrate 100. According to the illustrated embodiment, the first conductivity type is the n-type, the second conductivity type is the p-type, and the FET 199 is an n-channel FET. The pn-junctions extend approximately vertically, such that the impurity equiconcentration lines run approximately vertical to the main surface 101.

A gate dielectric 129 is arranged between the gate electrode 130 and the fin 104. The gate dielectric 129 may be a thermal grown silicon oxide liner. According to other embodiments, the gate dielectric 129 may be a deposited silicon oxide liner, for example, a silicon dioxide liner, a nitrided silicon dioxide liner, or another oxide or silicon oxide of elements of the third or fourth group including oxides of rare earths, for example, $Al_2O_3$, $HfO_2$, $HfSiO_2$, $LaO_2$, $LaSiO_2$, $DyO_2$, $DySiO_2$, or an other high-k material or mixtures thereof.

The gate electrode 130 may include or consist of, for example, p-doped or n-doped polysilicon, a metal or a metal compound having a suitable word function like tungsten, and/or a metal or metal compound with high electric conductivity like Ag, Au, Al, Cu, TaN, or TiN or may be a layer stack including a diffusion barrier layer and/or an adhesion layer and/or a material with a suitable work function and/or a metal or metal compound with high electric conductivity of more than 25*10E6 S/m.

The first and second spacer structures 122, 124 may be formed of a doped or undoped silicon oxide, for example, a silicon dioxide, silicon nitride, silicon oxynitride or another low-k material, or may have a laminated structure including, for example, different silicon oxide layers or at least one silicon oxide layer and a silicon nitride layer. The materials of the first and second spacer structures 122, 124 may be the same or they may differ from each other. The first and the second impurity regions 112, 116 may form complete source/drain regions of the FET 199 or portions of them, for example, extension regions. The third impurity region 114 forms a channel region, wherein in a conductive state of the FET 199, a conductive channel is formed in a portion of the channel region. Further impurity regions 113, 117 may be aligned to the edges of the second spacer structures 124 and may be effective, for example, as source/drain regions in a stricter sense.

The first sidewall spacer 122 wraps around the upper and two opposing lateral surfaces of the fin 104 and includes vertical portions 122*a* before and behind the cross-sectional plane as indicated by the dotted lines. The pn-junctions between the respective first or second impurity region 116, 112 and the third impurity region 114 may be formed in that portion of the fin 104 which is encompassed by the respective first spacer structure 122 such that the junctions are evenly spaced from the gate electrode 130. The strength of an electrical field, which is effective between the gate electrode and the source/drain region in an operation mode of the FET 199, is reduced evenly along the complete pn-junction and thus a gate induced leakage current may be reduced in a great part or in all portions of the pn-junction. On a substrate including a plurality of FETs 199, the first spacer structures 122 may be provided with high uniformity across the whole substrate and deviations in transistor performance may be reduced.

Figure 1C:
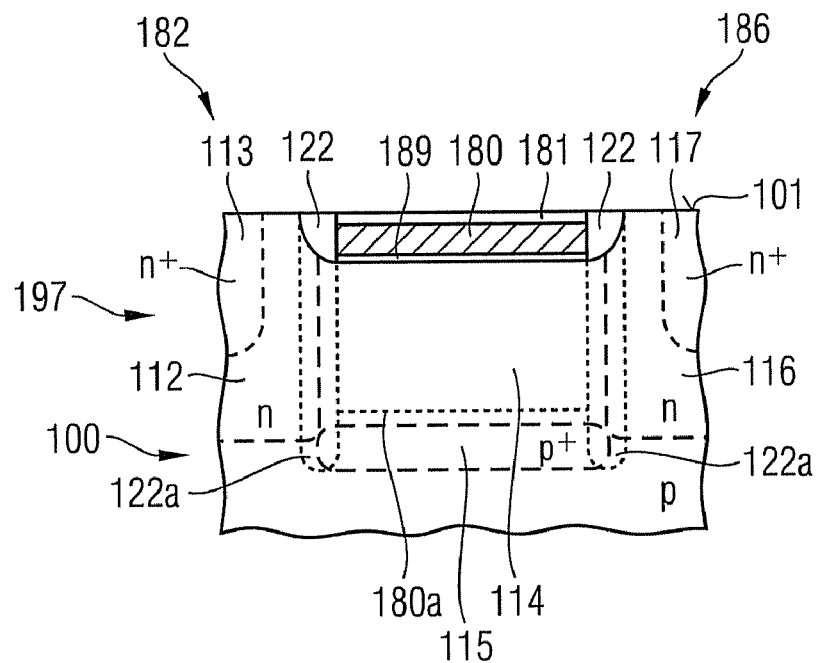
FIG. 1C illustrates a schematic cross-sectional view of a 3D-channel n-FET with completely buried gate electrode in accordance with one embodiment.

FIG. 1C refers to an n-FET 197 with completely buried gate electrode 180 having an upper edge which is situated below a main surface 101 of a substrate 100 and below the upper edges of first and second lamella portions 182, 186, in which, for example, source/drain regions 113, 117 and extension regions 112, 116 thereof may be formed. A channel region 114 is formed in a central lamella portion extending from the first to the second lamella portion 182, 186. A further impurity region 115 of the conductivity type of the channel region 114 and with a higher impurity concentration than the channel region 114 may be formed between the source/drain regions 113, 117 in a lower portion of the central lamella portion or below the lamella. The further impurity region 115 may be effective as an anti-punch-through structure, for example, in typical single-crystalline silicon wafers. The further impurity region 115 may be omitted on SoI-wafers. A gate dielectric 189 is situated between the central lamella portion and the gate electrode 180. An insulator fill 181 may be arranged between the main surface 101 and the upper edge of the gate electrode 180 and may insulate and/or electrically decouple the gate electrode 180 from further conductive structures arranged on or above the main surface 101. The dotted lines illustrate the arrangement of vertical portions 122*a* of first spacer structures 122 spacing the gate electrode 180, which includes vertical portions 180*a*, before and behind the cross-sectional plane from the extension regions 112, 116.

Figure 1D:
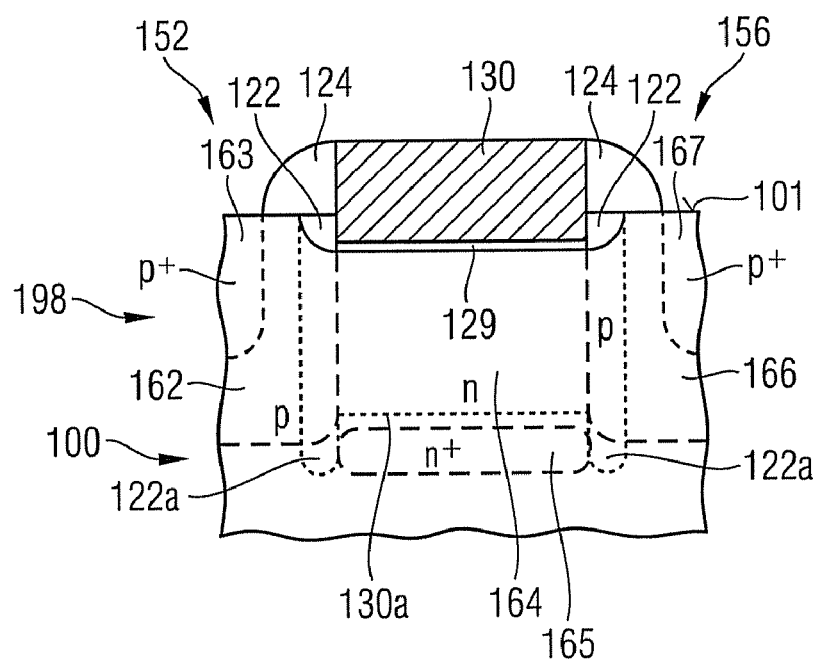
FIG. 1D illustrates a schematic cross-sectional view of a 3D-channel p-FET with protruding gate electrode portion in accordance with one embodiment.

FIG. 1D illustrates a p-FET 198 with heavily p-doped source/drain regions 163, 167 and lower p-doped extension regions 162, 166 in a first and a second lamella portion 152, 156. A channel region 164 is situated in a central lamella portion extending from the first to the second lamella portion 152, 156. A further impurity region 165 of the conductivity type of the channel region 164 may be formed between the source/drain regions 113, 117 in a lower portion of the central lamella portion or below the lamella and may be effective as an anti-punch-through structure. The gate electrode 130 may protrude above a main surface 101 of the substrate 100 or may be completely buried in the substrate 100. First spacer structures 122 define a distance between the extension regions 162, 166 and the gate electrode 130. Second spacer structures 124 may be formed along protruding portions of the gate electrode 130 and may define a distance between the source/drain regions 163, 167 and the gate electrode 130. The dotted lines refer to vertical portions 122*a* of the first spacer structures 122 and vertical portions 130*a* of the gate electrode 130 before and behind the cross-sectional plane.

Further FETs may be provided which include a combination of individual features of the FETs described with reference to FIGS. 1A-1D. FETs of different types may be combined in the same substrate or the same integrated circuit.

FIGS. 2A to 2G refer to a method of manufacturing FETs with a buried fin in a first region of a semiconductor substrate, wherein some of the processes may be combined with the fabrication of planar FETs in a second region of the substrate as illustrated in FIGS. 3A-3G. A semiconductor substrate may be patterned by an etch such that active area lines are defined in the semiconductor substrate. Each active area line forms a string of lamellas, wherein each lamella has a central portion and a first and a second lamella portion facing each other on opposing sides of the central portion, wherein the first lamella portion of one of the lamellas merges into the second lamella portion of the next lamella. An upper edge of the resulting lamellas is at or below a main surface of the substrate, on which the gate electrodes for planar transistors may be formed. Fins resulting from these lamellas are considered as "buried fins" in the sense of this disclosure.

Figure 2A:
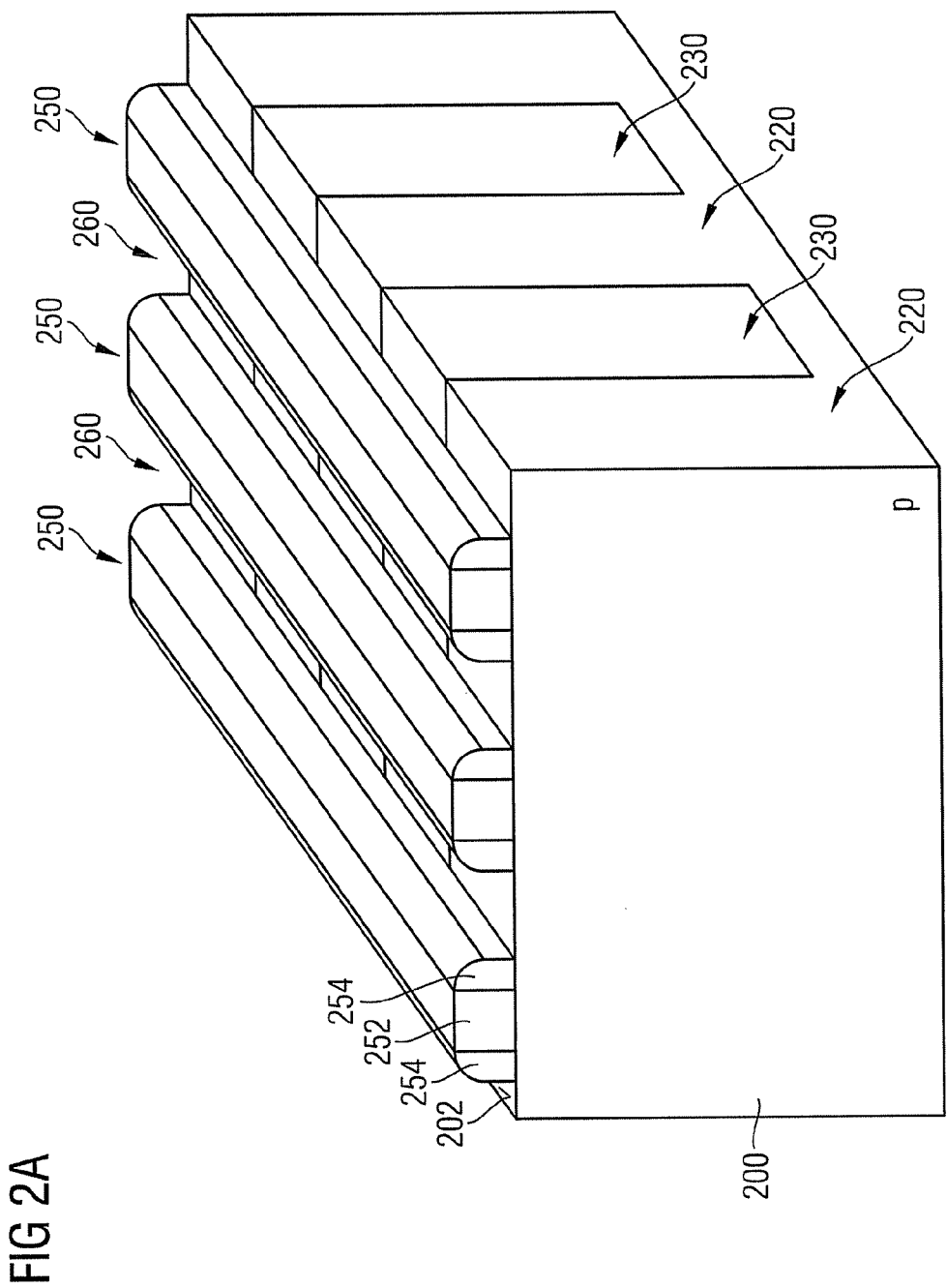
FIG. 2A illustrates a schematic perspective view of a first substrate region after providing mask strips crossing active area lines and line shaped insulator structures that are arranged in alternating order for illustrating a method of manufacturing an integrated circuit according to one embodiment.

FIG. 2A refers to a first region of a substrate 200 with parallel active area lines 220 arranged in alternating order with line-shaped insulator structures 230. In a second region of the substrate 200, isolated active islands may be formed that are embedded in further insulator structures. On the main surface 202 of the substrate 200, a hard mask with mask lines 250 is formed. The mask lines 250 cross over the active area lines 220 above the first and second lamella portions and the line-shaped insulator structures 230. In accordance with other embodiments, a protection liner may be formed at least on the active area lines 220 before a mask material is deposited. The protection liner may be, by way of example, a thermally grown silicon dioxide liner and may protect the active area lines 220 during formation and during the removal of the mask lines 250. The insulator structures 230 may be doped or undoped silicon oxide structures, for example, silicon dioxide structures, silicon nitride structures or structures of another dielectric material or layered dielectric structures. In accordance with the illustrated embodiment, the mask lines 250 run perpendicular to the active area lines 220. According to further embodiments, an angle between the active area lines and the mask lines is less than 90 degrees, for example, between about 35 and about 55 degrees. The mask lines 250 may include strip structures 252 and sidewall spacers 254 extending along the sidewalls of the strip structures 252. Further mask structures, for example, a mask template, may be formed in the second region of the substrate 200, for example, contemporaneously with the mask lines 250. Line-shaped spaces 260 between neighboring mask lines 250 expose portions of the insulator structures 230 and primary portions of the active area lines 220, wherein the primary portions correspond to the central lamella portions as mentioned above. The materials used for the mask lines 250 are selected to be effective as a hard mask during an etch of the insulator structures 230 and the active area lines 220. According to an embodiment, the strip structures 252 are amorphous or polysilicon structures and the sidewall spacers 254 are silicon nitride spacers. According to other embodiments, the mask lines 250 do not include sidewall spacers 254.

The active area lines 220 and the line-shaped insulator structures 230 are illustrated as being arranged at regular intervals for the purpose of simplification mainly. According to other embodiments, the distance between neighboring active area lines 220 varies, and/or the doping of the active area lines 220 may change from p-doped to n-doped along the respective active area line, and/or p-doped and n-doped active area lines 220 may alternate. The widths of the active area lines 220 may change along the active area lines 220 and/or from active area line 220 to active area line 220. Further, the mask lines 250 are illustrated as regular line pattern for the purpose of simplification predominantly. According to other embodiments, the widths, the distances and/or the lengths of the mask lines 250 may vary along each individual mask line 250 and/or from mask line 250 to mask line 250. Further mask lines may connect neighboring mask lines 250 in order to separate gate electrodes formed between them.

Figure 2B:
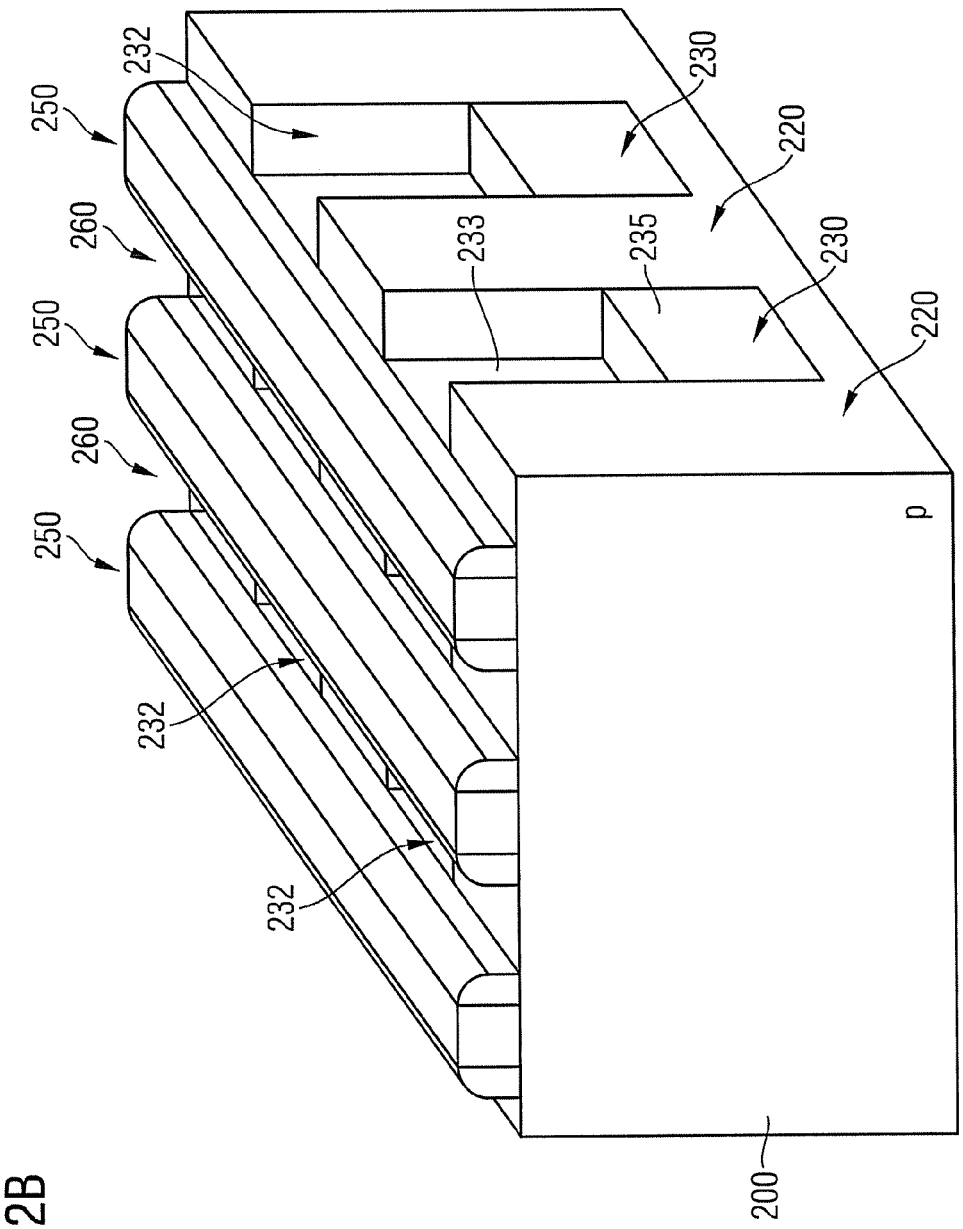
FIG. 2B illustrates a schematic perspective view of the substrate region of FIG. 2A after forming first grooves in the insulator structures.

According to FIG. 2B, the mask lines 250 may be used as an etch mask during a dry etch, for example, a reactive ion etch that is selective to both the material of the mask lines 250 and the material of the active area lines 220 such that first grooves 232 are formed in the insulator structures 230 between neighboring mask lines 250 and neighboring active area lines 220. The first grooves 232 expose vertical sidewalls of the central lamella portions on opposing second sides of the central lamella sections. During the etch, the second region of the semiconductor substrate 200 may be covered with a block mask that is formed before the first grooves 232 are formed. By way of example, the block mask may result from the same layer from which the mask lines 250 are formed. The etch of the insulator structures 230 defines insulator ridges 233 extending between neighboring active area lines 220 below each mask line 250 and above recessed insulator structures 235.

Figure 2C:
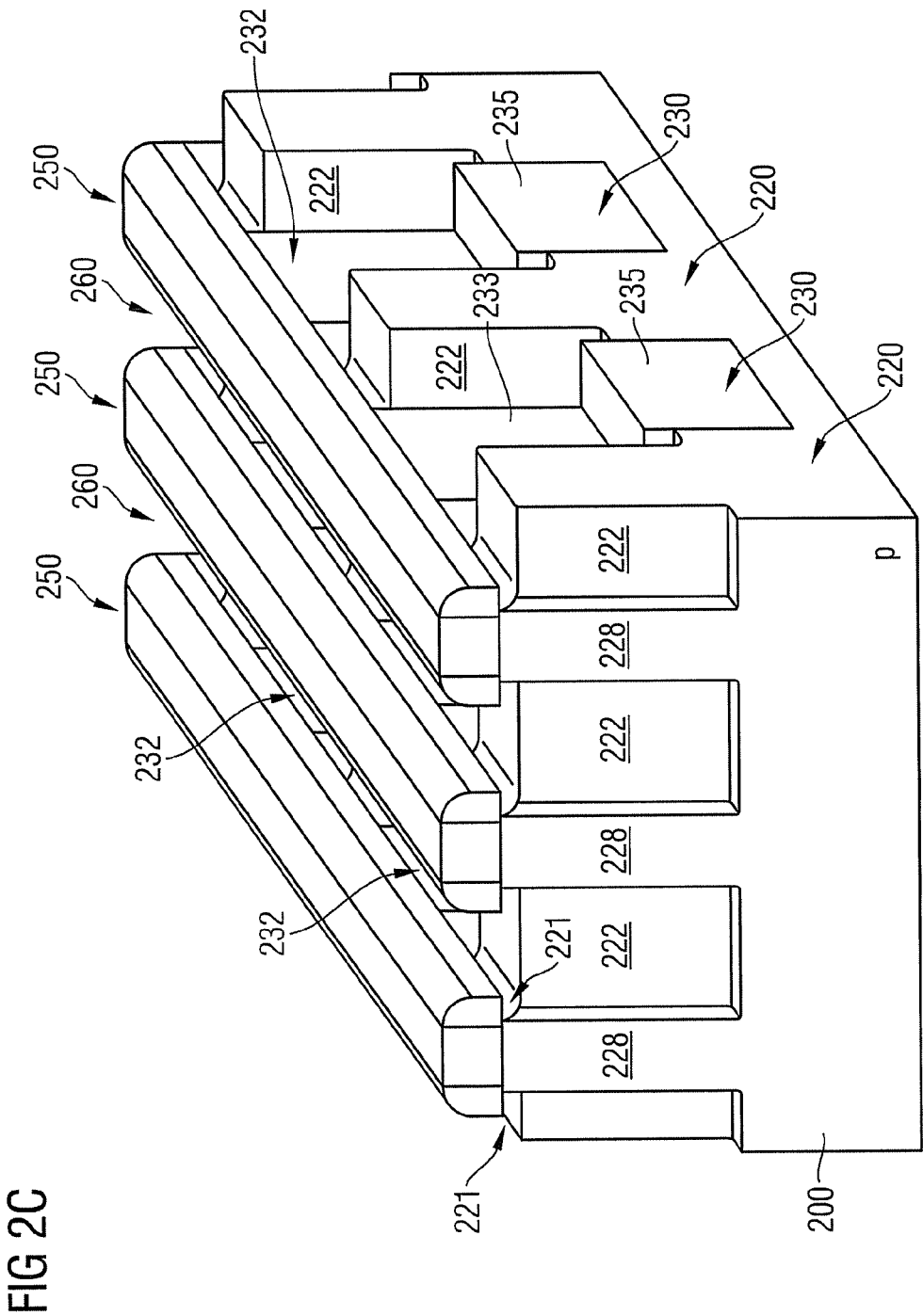
FIG. 2C illustrates a schematic perspective view of the substrate region of FIG. 2B after recessing isotropically exposed portions of the active area lines.

FIG. 2C illustrates the substrate 200 after an isotropic recess of the material of the active area lines 220, which may be performed using a chemical wet or dry etching method using, for example, $CF_4/O_2$, $SF_6/He$ or HF, $HNO_3$ or $CH_3COOH$. The etch attacks the active area lines 220 both from the sidewalls exposed by the first grooves 232 and from the exposed main surface 202. The second substrate region may remain covered with the first block mask or is covered with a second block mask that has replaced the first block mask. According to another embodiment, no block mask is provided in the second substrate region during the isotropic etch of the active area lines 220.

The etch process thins exposed (uncovered) portions of the active area lines 220, which correspond to the central lamella portions, to fins 222. The etch undercuts the mask lines 250 such that divots 221 are formed below the mask lines 250. The divots 221 are formed both above the upper edge of the fins 222 between the fins 222 and the mask lines 250 and along the vertical sidewalls of the fins 222 between the fins 222 and the insulator ridges 233. The divots 221 may undercut the mask lines 250 up to the edge of the strip structures 252 or beyond. Below the masked portions, unthinned secondary portions 228 of the active area lines 220 are formed, which correspond to the first and second lamella portions.

Figure 2D:
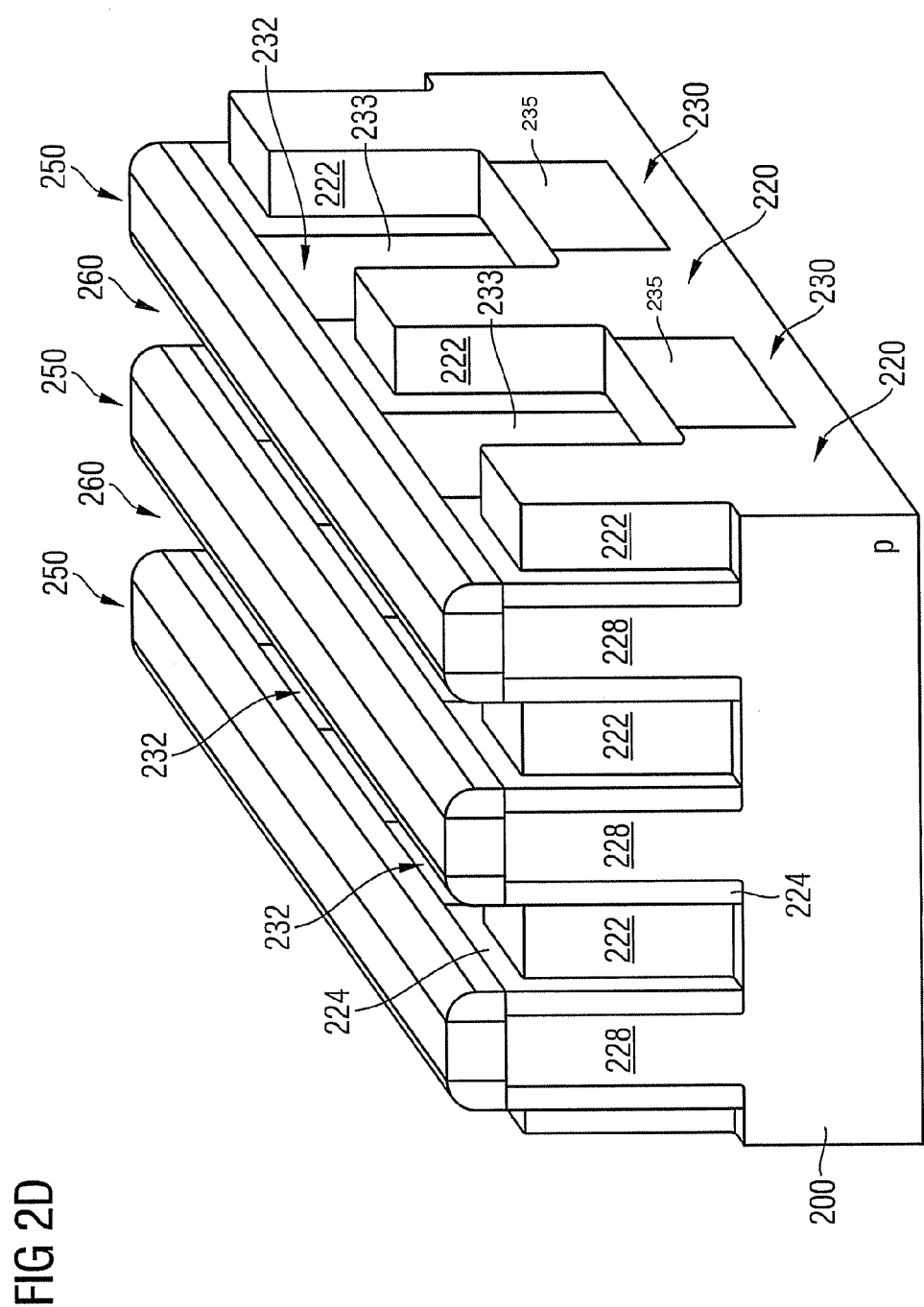
FIG. 2D illustrates a schematic perspective view of the substrate region of FIG. 2C after forming U-shaped spacer structures beneath the mask strips.

According to FIG. 2D, a block mask that may cover the second substrate region in the preceding processes may be removed. A protective liner, for example, a silicon nitride liner, may be deposited or grown at least on exposed portions of the semiconductor material in the first substrate region. An insulating material or a precursor material, which may be converted into an insulating material, may be deposited over the first and second substrate regions. The insulating material, for example, a silicon oxide resulting from the decomposition of tetra ethylene orthosilicate (TEOS), or the precursor material, which may be, for example, amorphous silicon, may fill completely or may line the first grooves 232 including the divots 221. The deposited insulator or precursor material may be recessed, for example, by reactive ion etching (RIE) or a chemical/mechanical polishing process (CMP) that stops at the upper edge of the mask lines 250. Then a second reactive ion etch process may be performed that is effective on the deposited insulator or precursor material and that is selective to the mask lines 250. From the precursor material, U-shaped precursor spacer structures may be formed in the divots 221 of FIG. 2C. Each precursor spacer structure may encompass a first portion of the respective fin adjoining to the neighboring secondary portion 228 on three sides. Then the precursor material may be converted into an insulating material via an oxidation process, wherein the protective liner may suppress an oxidation of the semiconductor substrate. The protective liner may be removed after the conversion.

As illustrated in FIG. 2D, U-shaped first spacer structures 224 are formed in the divots 221 of FIG. 2C from the insulator material or the precursor spacer structures. Each first spacer structure encompasses a first portion of the respective fin adjoining to the neighboring secondary portion 228 on three sides. The edges of the mask lines 250 are approximately flush both with the edges of the insulator ridges 233 and with the outer edges of the spacer structures. According to other embodiments, asymmetric first spacer structures 224 may be formed. For example, the formation on one side may be suppressed or one of the first spacer structures 224 may be removed later.

In the second substrate region, the deposited insulator or precursor material may be completely removed during the reactive ion etch. Then a wet clean may be performed to remove RIE damages and the semiconductor substrate 200 may be annealed in a hydrogen ambient.

Figure 2E:
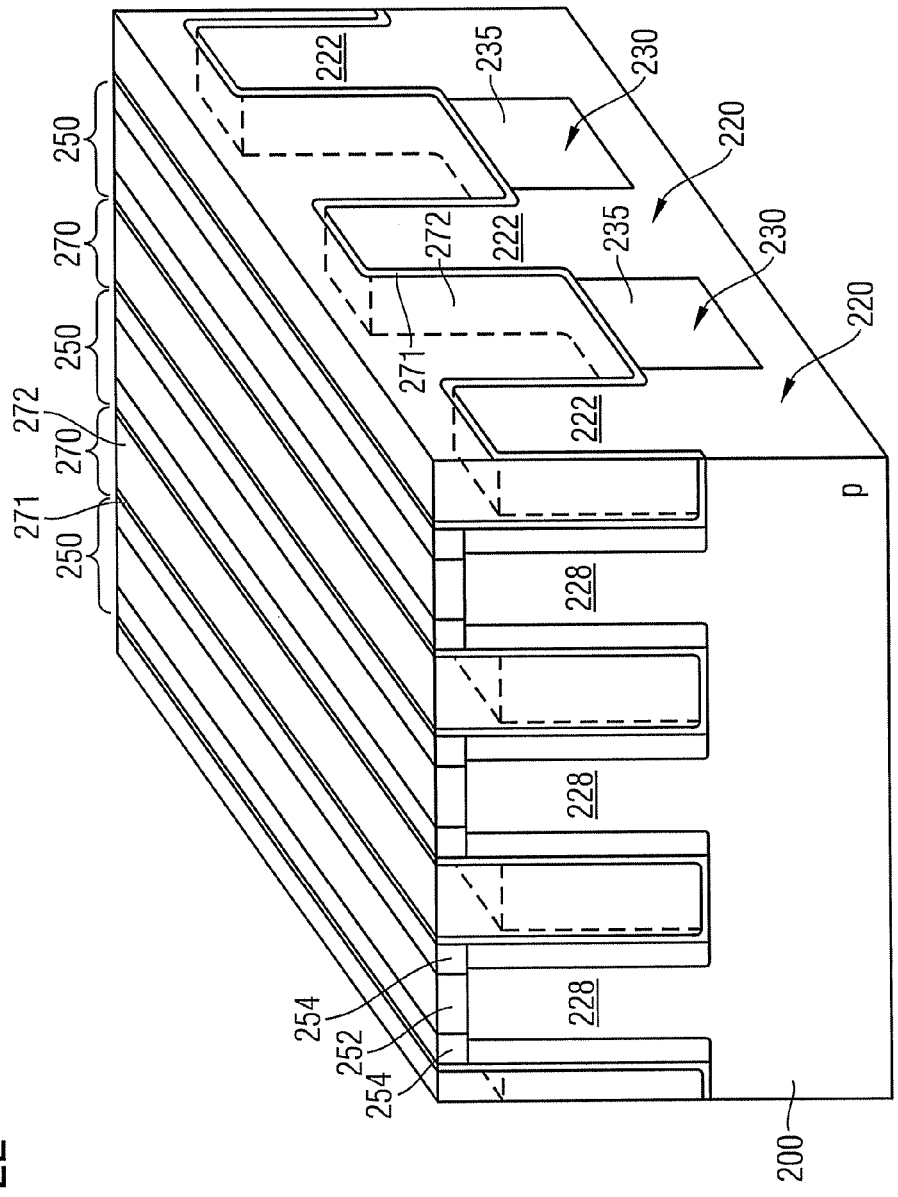
FIG. 2E illustrates a schematic perspective view of the substrate region of FIG. 2D after providing gate electrode structures.

With regard to FIG. 2E, a gate dielectric may be formed or deposited. The gate dielectric may be formed by oxidation of the material of the fins 222, by depositing a silicon oxide or a silicon dioxide or another oxide or silicon oxide of elements of the third or fourth group including oxides of rare earths, for example, $Al_2O_3$, $HfO_2$, $HfSiO_2$, $LaO_2$, $LaSiO_2$, $DyO_2$, $DySiO_2$, or an other high-k material or mixtures thereof. Then a gate electrode structure 270 may be formed in the first grooves 232 between the mask lines 250. The formation of the gate electrode structures 270 may include deposition of a seed or barrier liner 271, for example, a TiN-liner, and then depositing a conductive fill material 272, like a metal or a metal compound, for example, tungsten, aluminum, or another material with an electric conductivity higher than that of tungsten. The formation of the gate electrode structures 270 may be effective both in the first and the second regions of the substrate 200, wherein in the second substrate region the gate electrodes of planar transistors devices may be formed. After deposition of the conductive fill material 272, a chemical mechanical polishing process may be performed which stops at or below the upper edge of the mask lines 250, wherein the gate electrode structures 270 are formed in the first substrate region and further gate electrode structures may be formed in the second substrate region. According to other embodiments, a sacrificial material may be filled into the first grooves 232 in lieu of the gate electrode structures 270, for example, polysilicon or tungsten, and a sacrificial liner may be provided in lieu of the gate dielectric.

In accordance with another embodiment, the fill material 272 may be recessed to below the main surface 202 and/or to below the upper edges of the secondary portions 228. Another fill material may be deposited and recessed to cover at least temporarily the fill material 272.

FIG. 2E illustrates comb-shaped gate electrode structures 270 extending between neighboring mask lines 250 and encompassing associated fins 222 on opposing second sides and on the top side, respectively. The first spacer structures 224 space the gate electrode structures 270 and the neighboring secondary portions 228. In the second substrate region, gate electrodes of planar FETs, diodes, resistors and further passive electronic devices may be formed in the mask template. The gate electrode structures 270 are formed in a self-aligned manner with respect to the fins. As one consequence thereof, each gate electrode structure 270 may be centered to the respective fin.

Figure 2F:
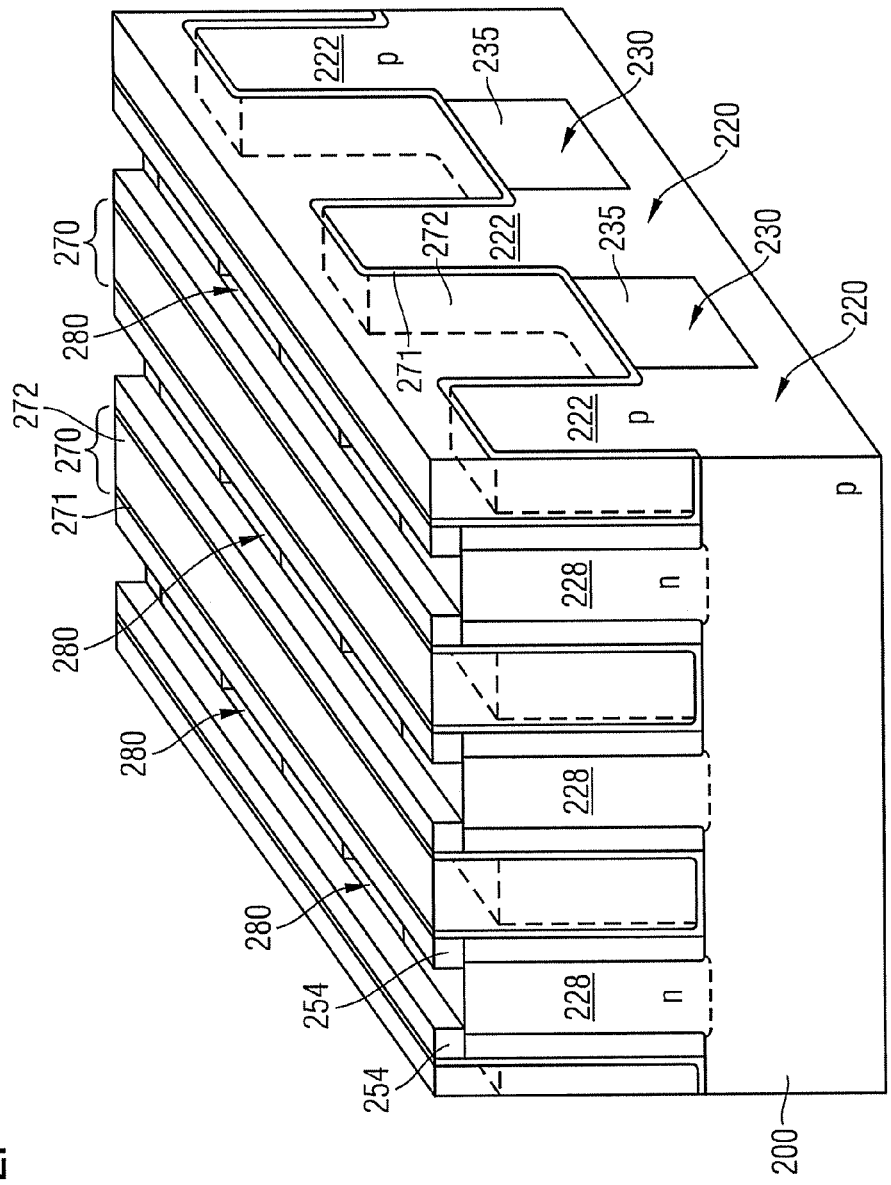
FIG. 2F illustrates a schematic perspective view of the substrate region of FIG. 2E after forming second grooves in the insulator structures.

According to FIG. 2F, the mask lines 250 may be removed in parts or completely. In accordance to an embodiment, the strip structures 252 may be removed, whereas the sidewall spacers 254 may be left. According to other embodiments, the mask lines 250 may be removed completely. Thereby a protection liner as discussed with regard to FIG. 2A may be effective as an etch stop liner protecting the upper edges of the secondary portions 228. A further anisotropic etch process may be used to form second grooves 280 in the insulator structures 230 between neighboring lamella portions 228. A further block mask may cover the second substrate region during the selective oxide etch.

FIG. 2F illustrates the second grooves 280 in the insulator structures 230 between opposing first sidewall spacers 254 and the secondary portions 228. Impurities may be introduced into the secondary portions 228 by a diffusion process, for example, by gas phase or solid phase doping through the upper surface and the exposed sidewall surfaces of the lamella portions 228 in order to form the source/drain regions. In accordance with further embodiments referring to shallow vertical dimensions, an angled ion-beam implant may be performed to introduce the impurities into the secondary portions 228. As a result thereof, the source/drain regions are formed in a self-aligned manner with respect to the gate electrode structures 270.

The doping process may also be effective in those subportions of the second substrate region in which transistors of the same conductivity type as in the first region are formed. In accordance with an embodiment, in the first substrate region n-FinFETs are formed as illustrated. In this case, first subportions of the second substrate region that include p-FETs may be covered with an AlO-mask and arsenic may be introduced both into the secondary portions 228 and next to the gate electrode structures of n-FETs in the first sub-portions. Then the first substrate region and the first sub-portions of the second substrate region may be covered with a mask, for example, a silicon nitride mask, and, for example, $B_2H_6$ or $BH_3$, may be used to introduce impurities next to the gate electrodes of p-FETs arranged in a second sub-portion of the second substrate region. The AlO-mask and the silicon nitride mask may also cover first and second sub-portions of the first substrate region to form p-FETs and n-FETs therein.

Figure 2G:
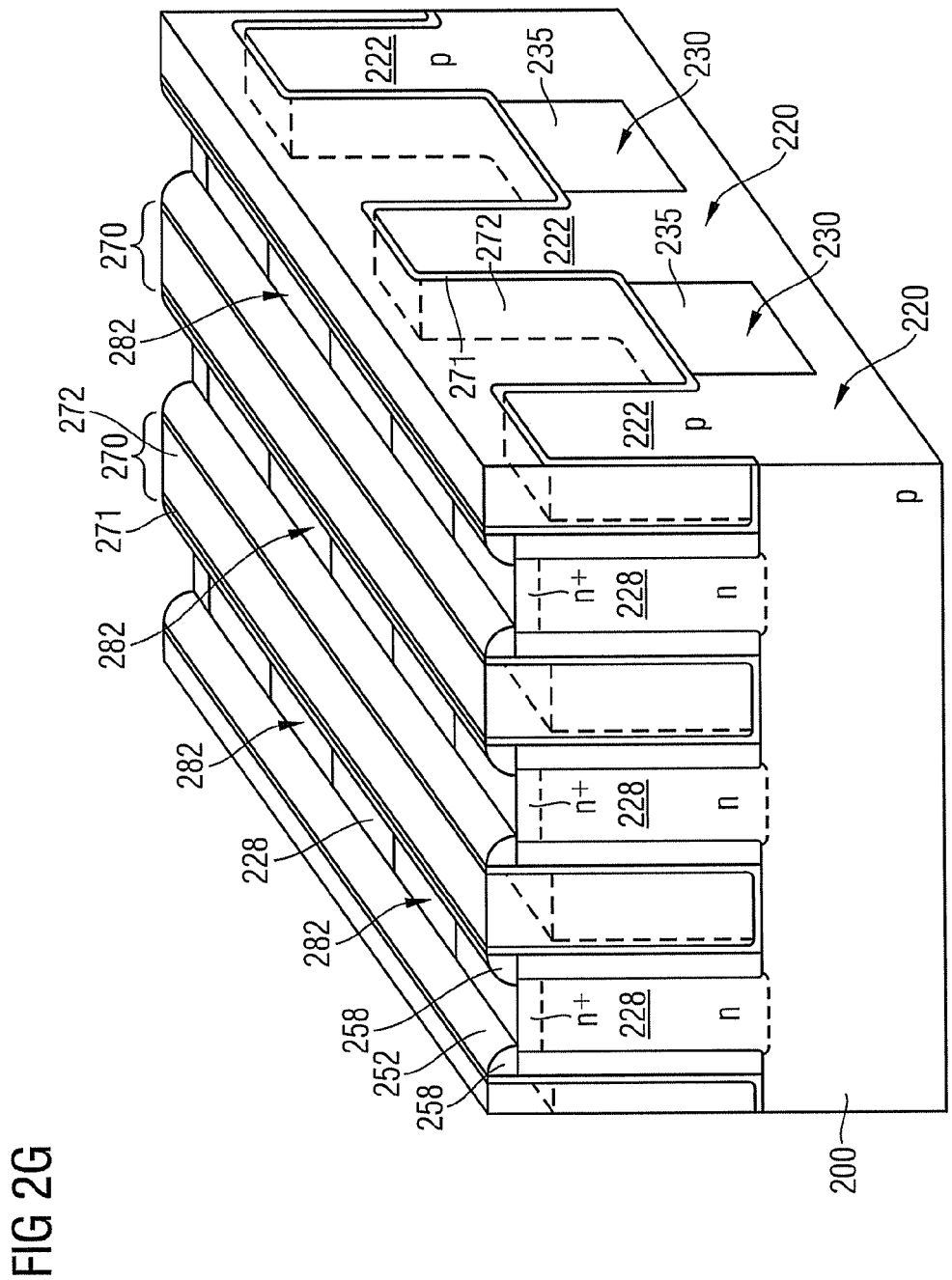
FIG. 2G illustrates a schematic perspective view of the substrate region of FIG. 2F after performing further implants.

With regard to FIG. 2G, a further insulating material may be deposited over the first and second substrate regions, wherein the second grooves 280 may be filled, for example, a silicon oxide, resulting from the decomposition of TEOS. Second sidewall spacers 258 may be formed along the protruding portions of the electrode structures 270 that result from the deposited insulating material filling the second grooves 280 or from a second, conformal deposition of a suitable insulating material, for example, silicon dioxide or silicon nitride. The width of the second sidewall spacers 258 may align a further implant that may define contact regions in an upper section of the lamella portions 228. In case of a replacement gate approach, after annealing the further implant a sacrificial material provided in lieu of the gate electrode structures and, if applicable, a sacrificial liner provided in lieu of the gate dielectric may be replaced with the final gate electrode structures and the final gate dielectric.

Contemporaneously with the second sidewall spacers 258, equivalent sidewall spacers along vertical sidewalls of the gate structures in the second substrate region may be formed. The FETs formed in the first substrate region may be part of any logic circuit, for example, an inverter circuit for logic or driver applications or a sense amplifier, wherein the logic circuit may be configured to access, to control and/or to read out a memory device, for example, a DRAM (dynamic random access memory), a FBRAM (floating body random access memory), a FeRAM (ferroelectric random access memory, a PCRAM (phase change random access memory), a MRAM (magnetoresistive random access memory) or an EPROM (erasable programmable read only memory).

FIGS. 3A-3G refer to the formation of planar FETs in the second substrate region, wherein a subset of the processes effective in the first substrate region is also used in the second substrate region.

Figure 3A:
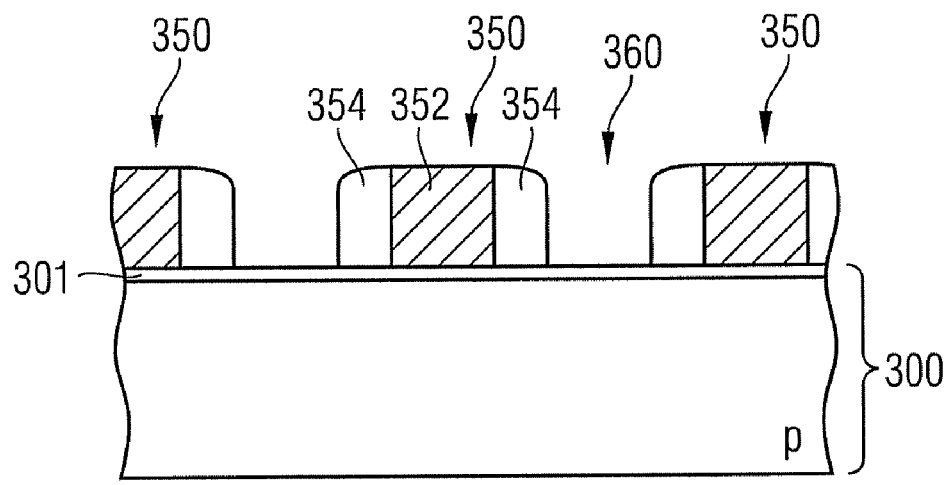
FIG. 3A corresponds to FIG. 2A and illustrates a schematic cross-sectional view of a further region of the substrate as illustrated in FIG. 2A after providing a mask template.

According to FIG. 3A contemporaneously with the formation of the mask lines 250, a mask template 350 may be formed above a second region of substrate 300. The mask template 350 includes openings 360 above isolated active area regions. The mask template 350 may include a base structure 352 and first sidewall spacers 354 lining the vertical sidewalls of the openings 360. The openings 360 may be assigned to single transistors or to groups of transistors arranged along a line.

Figure 3B:
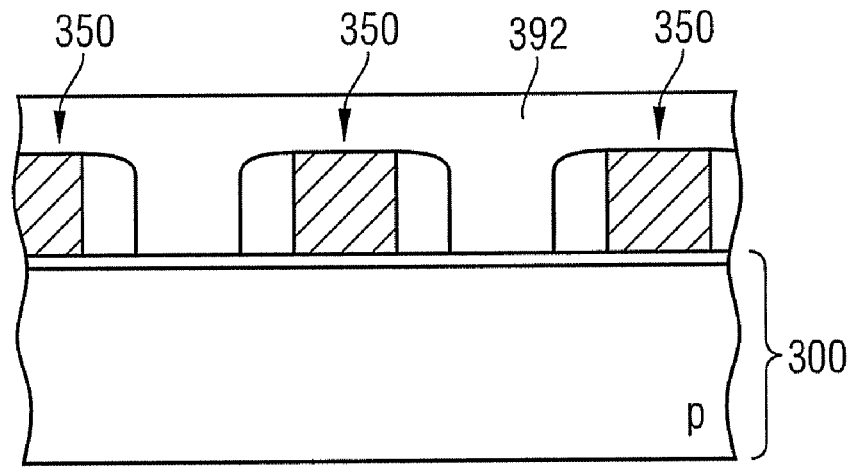
FIG. 3B corresponds to FIG. 2B and is a schematic cross-sectional view of the further substrate region of FIG. 3A after forming first grooves in the first substrate region according to FIG. 2B.
Figure 3C:
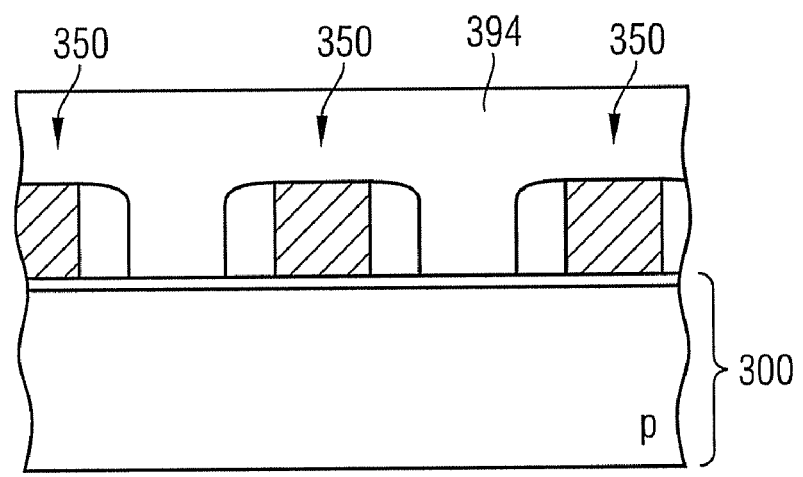
FIG. 3C corresponds to FIG. 2C and is a schematic cross-sectional view of the further substrate region of FIG. 3B after recessing isotropically the active area lines in the first substrate region.

During the formation of the first grooves and the isotropic recess of the active area lines in the first substrate region, the second substrate region may be covered with a hard mask 392, 394 respectively, as illustrated in FIGS. 3B and 3C. According to an embodiment, one hard mask, for example, a carbon mask, is used both during the formation of the first grooves and during the anisotropic recess of the active area lines. The first hard mask 392 may be omitted if the mask template 350 covers the isolation structures between isolated active areas completely.

Figure 3D:
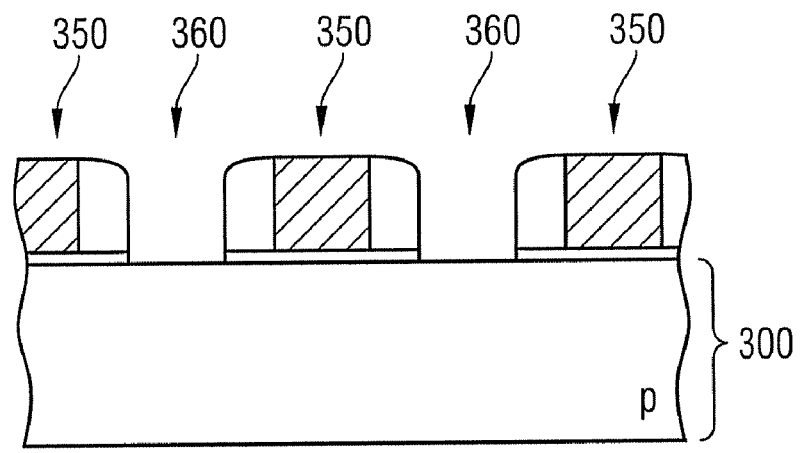
FIG. 3D corresponds to FIG. 2D and is a schematic cross-sectional view of the further substrate region of FIG. 3C after forming U-shaped spacer structures in the first substrate region.

According to FIG. 3D, the insulator material which forms the first spacer structures in the first substrate region may be completely removed in the second substrate region.

Figure 3E:
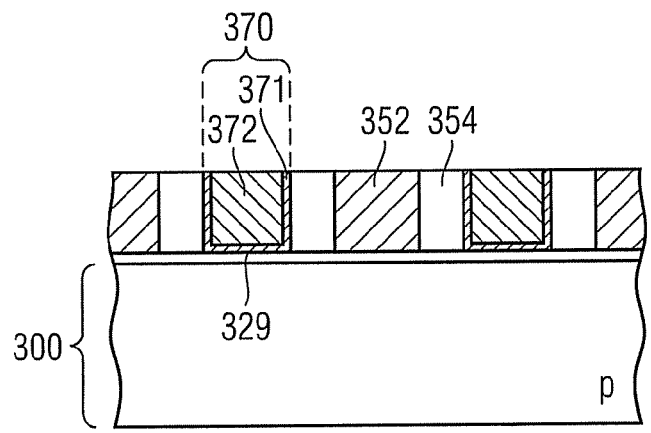
FIG. 3E corresponds to FIG. 2E and is a schematic cross-sectional view of the further substrate region of FIG. 3D after providing gate electrode structures.

As illustrated in FIG. 3E, isolated gate electrode structures including a seed or barrier layer 371 and a conductive fill 372 may be formed contemporaneously with the formation of the gate electrode structures in the first substrate region.

Figure 3F:
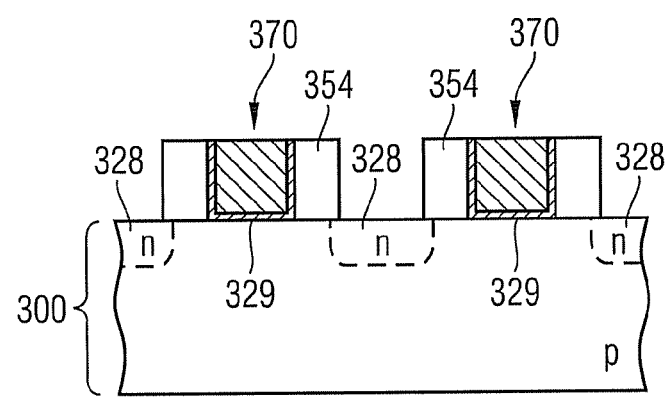
FIG. 3F corresponds to FIG. 2F and is a schematic cross-sectional view of the further substrate region of FIG. 3E after forming second grooves in the first substrate region.

With regard to FIG. 3F, the sidewall structures 354 may be used to align a first implant to the gate electrodes 370. According to other embodiments, the sidewall structures 354 may be replaced by further sidewall structures in the second substrate region before implanting impurities for the formation of source/drain regions in the second substrate region.

Figure 3G:
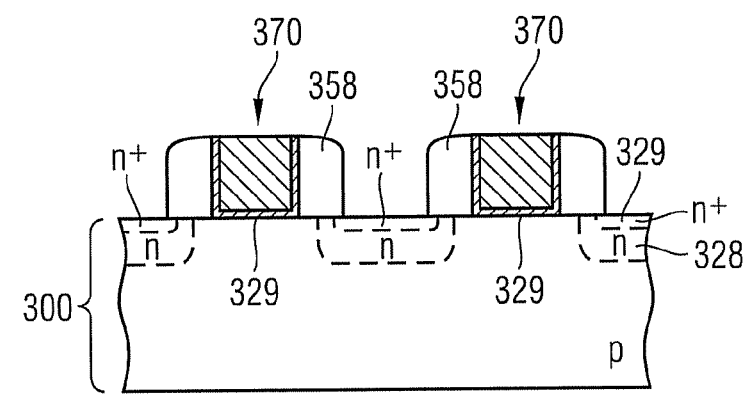
FIG. 3G corresponds to FIG. 2G and is a schematic cross-sectional view of the further substrate region of FIG. 3F after performing further implants.

Referring to FIG. 3G, the sidewall structures 354 may be replaced with further sidewall structures 358 in order to align a second implant for the formation of highly doped contact regions 329.

Figure 4:
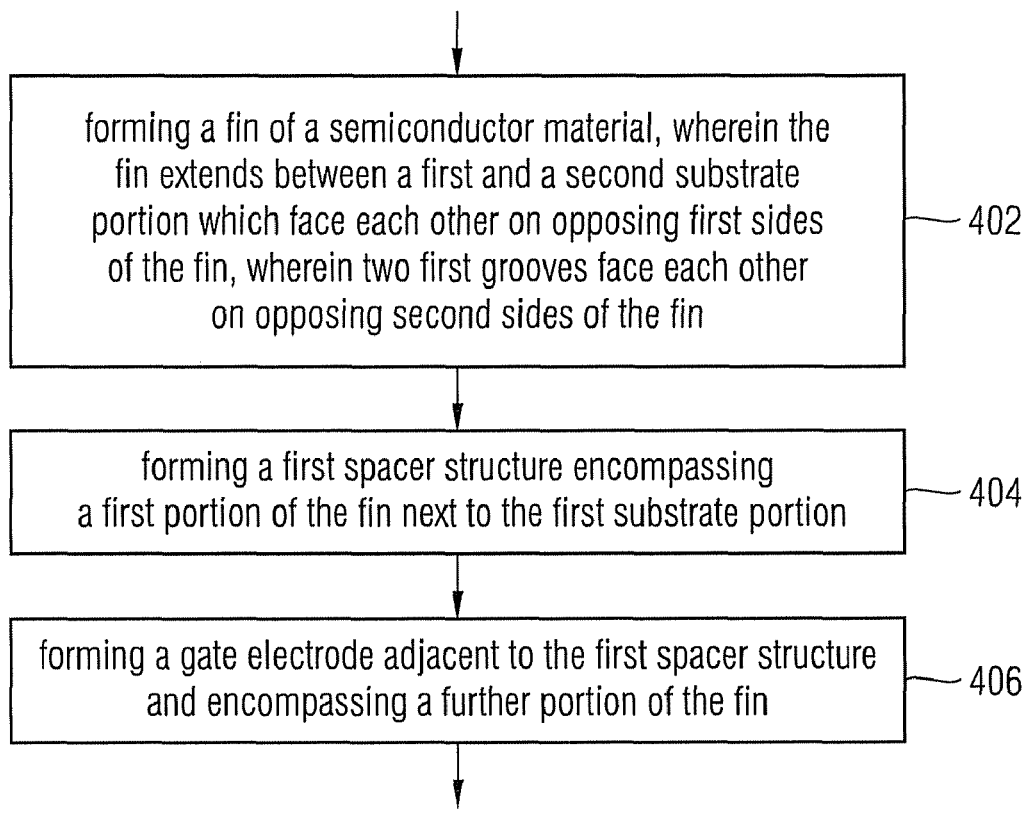
FIG. 4 is a flow chart illustrating a method of manufacturing an integrated circuit including a 3D-channel FET according one embodiment.
Figure 5:
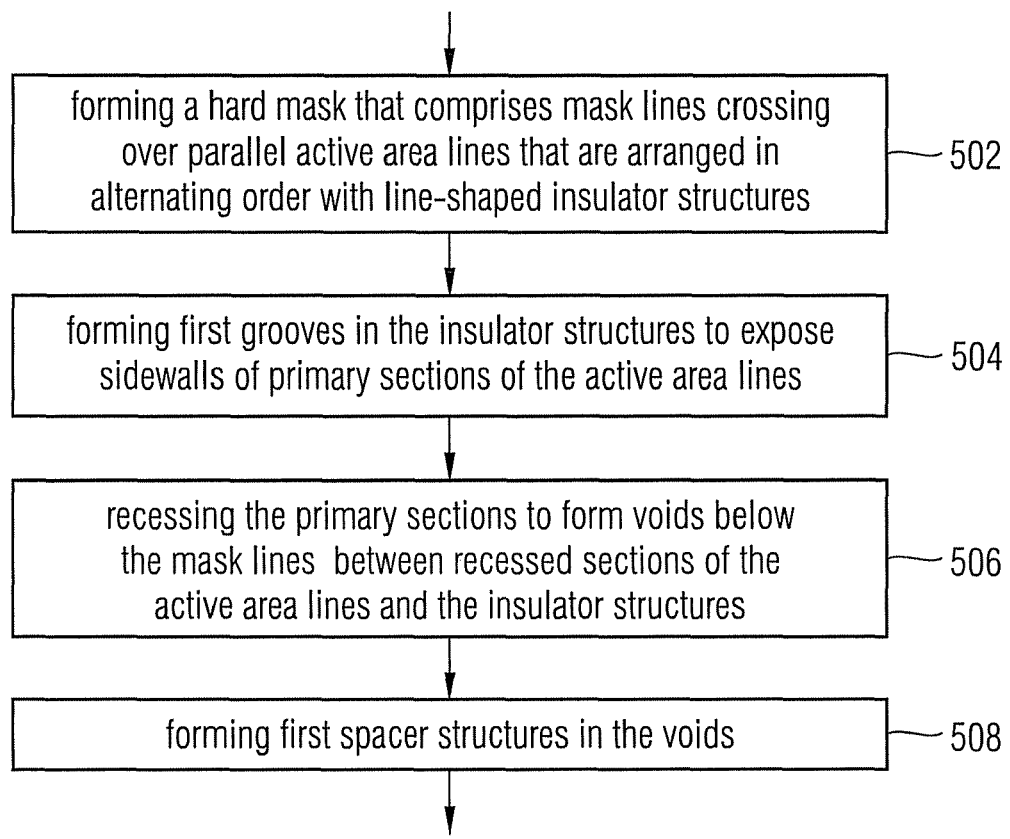
FIG. 5 is a flow chart illustrating a method of manufacturing an integrated circuit including a plurality of 3D-channel FETs in accordance with one embodiment.

FIG. 4 refers to a method of manufacturing an integrated circuit with a field effect transistor. A fin of a semiconductor material is formed, wherein the fin extends between a first and a second substrate portion, which face each other on opposing first sides of the fin, and two insulator structures face each other on opposing second sides of the fin (402). Then a first spacer structure is formed which encompasses a first portion of the fin on two or three sides next to the first substrate portion (404). The first spacer structure may directly adjoin to the first substrate portion. Then a gate electrode is formed which adjoins directly to the first spacer structure and which encompasses and wraps around a further portion on two or three sides of the fin (406). A second spacer structure may be formed before the gate electrode next to the second substrate portion in an equivalent way, for example, contemporaneously with the first spacer structure FIG. 5 refers to a simplified flow chart of a further method of manufacturing an integrated circuit that includes a dense arrangement of field effect transistors. A hard mask is formed that includes mask lines crossing over parallel active area lines that are arranged in alternating order with line-shaped insulator structures (502). The mask lines run along a first direction intersecting a second direction along which the active area lines run. In the insulator structures, first grooves are formed to expose sidewalls of primary portions of the active area lines (504). The primary portions are recessed, wherein divots are formed between recessed portions of the active area lines and the insulator structure below the mask lines (506). Then first spacer structures are formed in the divots (508). Then the mask lines may be removed and second grooves may be formed in the insulator structures between gate electrode structures formed between the mask lines to expose sidewalls of second portions of the active area lines. Dopants may be introduced into the second portions using, for example, a diffusion process, to form impurity regions which are aligned to the first spacer structures formed in the divots.

Figure 6:
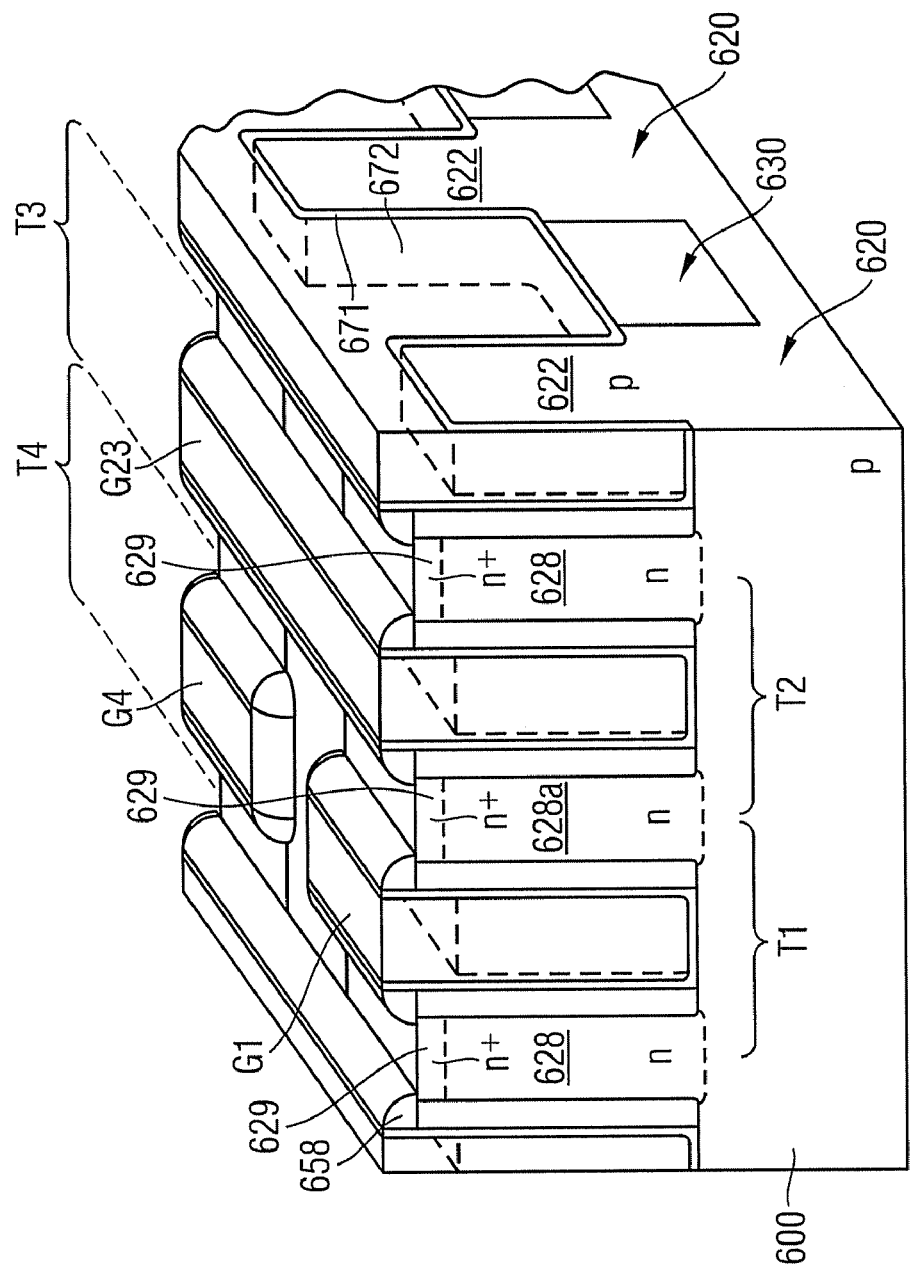
FIG. 6 illustrates a schematic perspective view of a substrate portion including a dense arrangement of 3D-channel FETs in accordance with one embodiment.

FIG. 6C refers to a dense arrangement of 3D-channel FETs T1-T4. In a substrate 600 isolation structures 630 isolate neighboring active area lines 620. In the lamella-like active area line 620 in the foreground, two FETs T1 and T2 are formed that may include n-doped source/drain regions 628, 628a and heavily n-doped contact regions 629. P-doped channel regions 622 are formed in fins that are thinner than the lamella portions in which the source/drain regions 628 are formed. The p-doped channel regions 622 may be connected to a voltage source supplying a voltage, for example, a constant direct-current voltage.

The FETs T1, T2 share a common source/drain region 628a. A first gate electrode G1 is configured to control the first FET T1 and a second gate electrode G23 is configured to control the second FET T2. The second gate electrode G23 extends above two neighboring active area lines 620 and is further configured to control a third FET T3 sharing a common source/drain region with a fourth transistor T4, which is controlled via a fourth gate electrode G4. The fourth gate electrode G4 may extend in a longitudinal projection of the first gate electrode G1. The gate electrodes G1-G4 may include a seed or barrier liner 671 and a fill material 672 as discussed above. Dielectric second sidewall structures 658, for example, of a silicon oxide or a silicon nitride, may be formed on sidewalls of protruding gate electrode portions. The arrangement as illustrated may result from the process flow as discussed with regard to the FIGS. 2A to 2G, wherein the first and fourth gate electrode may be isolated by a further patterning process performed after formation of the source/drain regions 628 and before forming the contact regions 629.

Figure 7A:
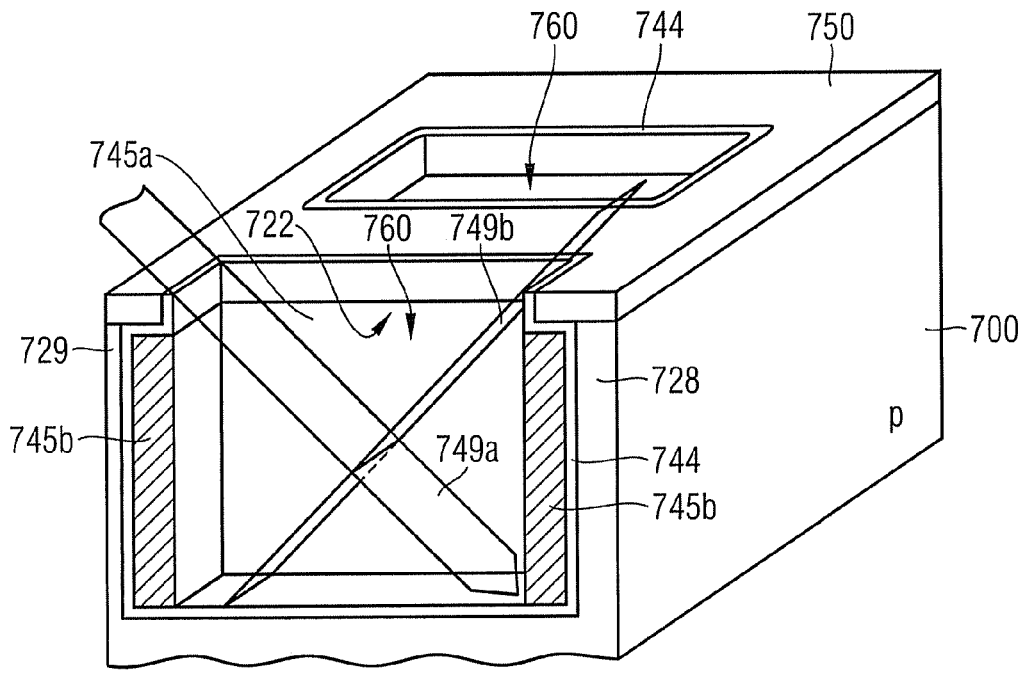
FIG. 7A illustrates a schematic perspective view of a substrate portion for illustrating a method of manufacturing an integrated circuit according to one embodiment including a conversion of a precursor material after performing a tilted implanted.
Figure 7B:
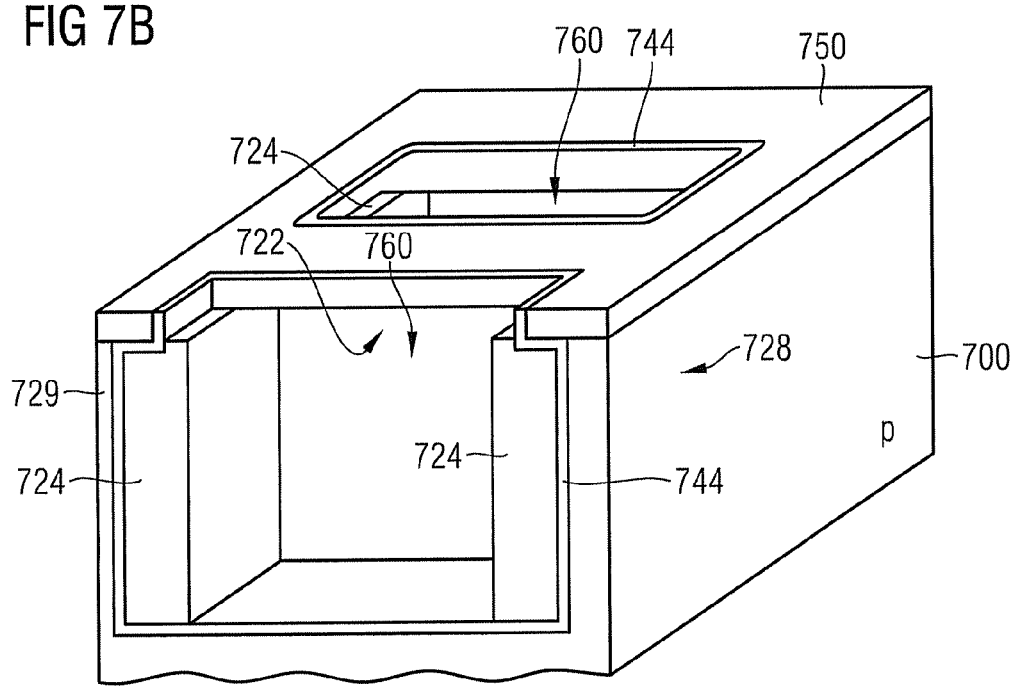
FIG. 7B illustrates a schematic perspective view of the substrate portion of FIG. 7A after conversion of the precursor material.

FIGS. 7A to 7B refer to a method of manufacturing field effect transistors in accordance with a further embodiment, according to which the material of the spacer structures is formed selectively at the target positions so as to avoid the removal of the spacer material from the fin sidewalls.

According to FIG. 7A, a hard mask 750 may be formed on or above a main surface of a substrate 700 which is made of a semiconductor material, for example, single crystalline silicon. The hard mask 750 covers a fin portion of the substrate 700 and first 728 and second substrate portions 729 facing each other on opposing first sides of the fin portion. The hard mask 750 has openings on opposing second sides of the fin portion. Using the hard mask 750 as an etch mask, the substrate 700 is etched to form first grooves 760 on opposing second sides of the fin portion to expose vertical sidewalls of the fin portion. The semiconductor material may then be isotropically etched, wherein the fin portion is thinned to a fin 722. The isotropic etch widens the first groves 760 such that the first grooves 780 undercut the hard mask 750 along the fin 722 and along the first and second substrate portions 728, 729, wherein divots are formed below the hard mask 750.

An anti-oxidation liner 744 may be formed at least on uncovered surfaces of the substrate 700, for example, the exposed vertical fin sidewalls and sidewalls of the first and second substrate portions 728, 729 oriented to the first grooves 760. In accordance with an embodiment, the anti-oxidation liner 744 may be a silicon nitride liner having a thickness of about 2 to 10 nm. A precursor material is then deposited onto the anti-oxidation liner 744, for example, via a highly conformal deposition method like ALD (atomic layer deposition) or CVD (chemical vapor deposition) to fill the divots. The etch properties of the precursor material may be altered by radiation or a directed particle beam. An anisotropic etch may remove portions of the precursor material outside the divots to form, in the first grooves 760, first precursor spacers 745a along the fin 722 and second precursor spacers 745b along the first and second substrate portions 728, 729. One or two, for example, symmetrically, tilted radiation or particle beams 749a, 749b, for example, two symmetric $BF_2$ particle beams with a main plane of incidence parallel to the direct connection line between the first and the second substrate portions 728, 729 may be directed to the substrate 700. The radiation or particle beams 749a, 749b may alter, for example, the etch properties of the second precursor spacers 745b, whereas the first precursor spacers 745a remain unaffected. In accordance with further embodiments, implanted particles may be diffused in neighboring sections such that the doped sections of the precursor spacers 745a, 745b reach into the corners between the fin 722 and the first and second substrate portions 728, 729 and adjoin directly to the fin 722.

Referring to FIG. 7B, the first precursor spacers 745a may then be removed selectively against the second precursor spacers 745b. In accordance with another embodiment, the etch resistance of the first precursor spacers 745a may be decreased using, for example, two symmetric tilted radiation or particle beams with a main plane of incidence perpendicular to the direct connection line between the first and second substrate portions 728, 729. Then the second precursor spacer 745 may be oxidized, for example, via a heating process in an oxygen containing ambient, so as to form spacer structures 724 of, for example, a silicon oxide such as silicon dioxide. The spacer structures 724 extend along sidewalls of the first and second substrate portions 728, 729. As the spacer structures 724 can be selectively formed at their target positions exclusively, an anisotropic etch of an insulator material may be avoided and the formation of insulator fences along the fin 722 may be suppressed. Later, a gate electrode encompassing a further portion of the fin on at least two, opposing sides may be formed between the spacer structures 724. The formation of one of the spacer structures 724 may be omitted or one of the spacer structures 724 may be removed before the formation of the gate electrode in order to provide asymmetric devices. By way of example, one single tilted radiation or particle beam, or two asymmetrically tilted radiation or particle beams with different angles of incidence may be used to form asymmetric devices.

Figure 8A:
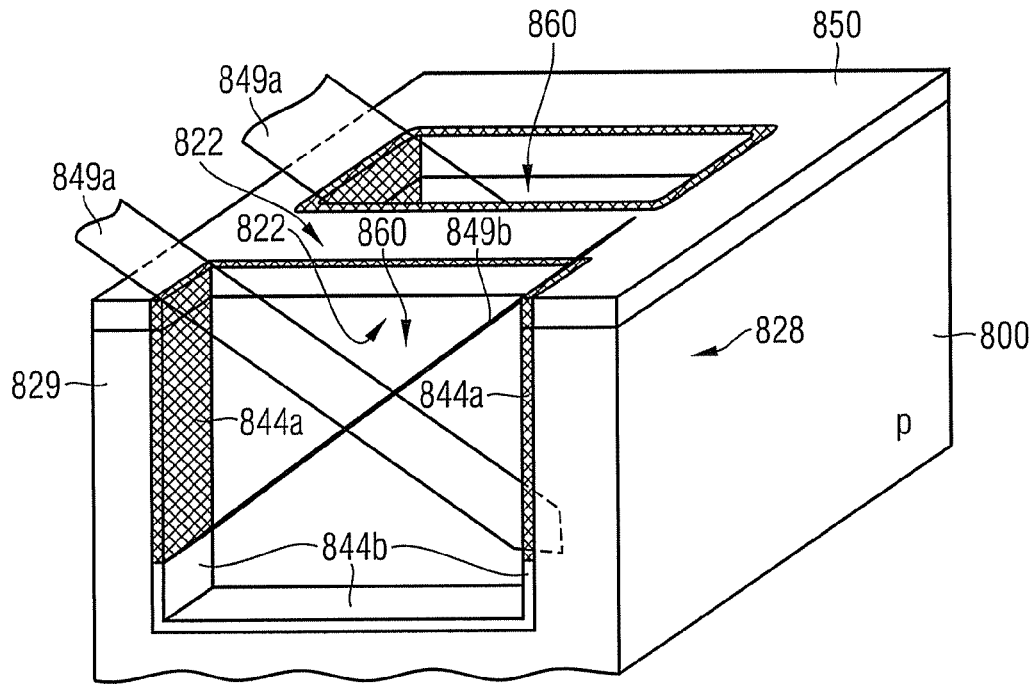
FIG. 8A illustrates a schematic perspective view of a substrate portion for illustrating a method of manufacturing an integrated circuit according to one embodiment using a conversion mask.
Figure 8B:
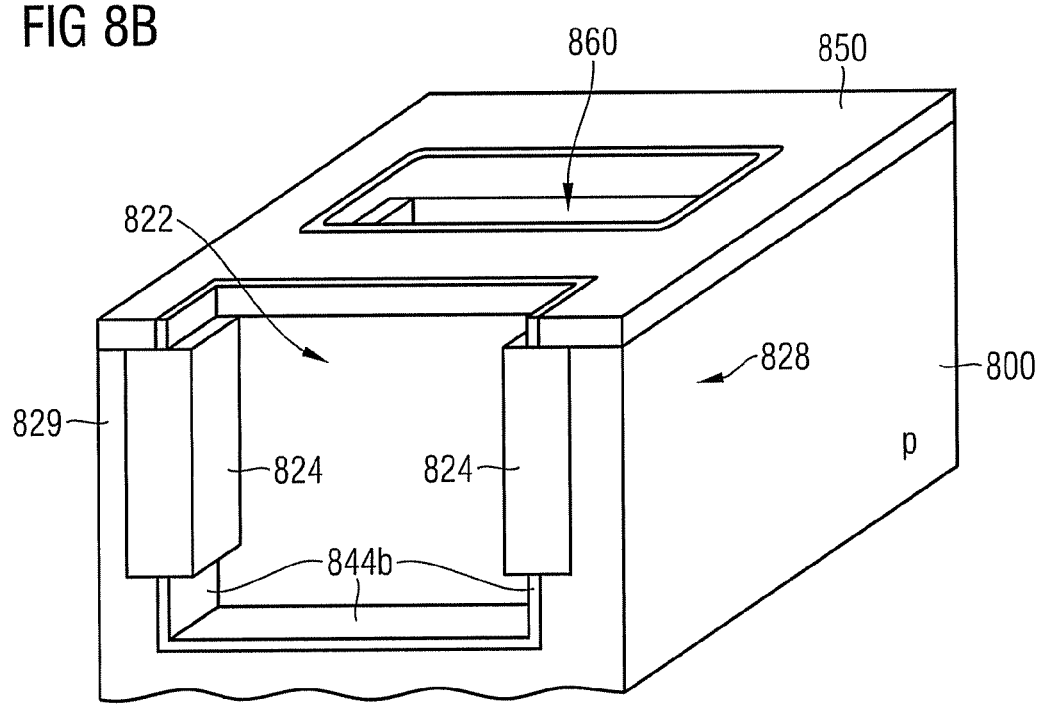
FIG. 8B illustrates a schematic perspective view of the substrate portion of FIG. 8A after forming sidewall spacers.

FIGS. 8A to 8B refer to another method of manufacturing FinFETs in accordance with a further embodiment according to which the material of the spacer structures is formed by a masked oxidation at the target positions so as to avoid the removal of a spacer material from the fin sidewalls.

As illustrated in FIG. 8A, a hard mask 850 may be formed on or above a main surface of a substrate 800 of a semiconductor material, which may be, for example, single crystalline silicon. The hard mask 850 covers a fin 822 and first and second substrate portions 828, 829 facing each other on opposing first sides of the fin 822, wherein the fin and the first and second substrate portions 828, 829 are sections of the substrate 800. The hard mask 850 may have openings on opposing second sides of the fin 822. Using the hard mask 850 as an etch mask, the semiconductor material is etched to form first grooves 860 on opposing second sides of the fin 822 and to expose vertical sidewalls of the fin 822. An anti-oxidation liner with first portions 844a and second portions 844b is formed that covers at least uncovered portions of the substrate 800, like the exposed vertical fin sidewalls and sidewalls of the first and second substrate portions 828, 829 oriented to the first grooves 860.

In accordance with one embodiment, the anti-oxidation liner 844a, 844b is made of a material, the etch properties of which may be altered by radiation or a directed particle beam, for example, by a xenon implant. For example, the anti-oxidation liner 844a, 844b may be a silicon nitride liner. One or two symmetric radiation or particle beams, for example, two symmetrically tilted xenon particle beams 849a, 849b, with a main plane of incidence parallel to the direct connection line between the first and the second substrate portion 828, 829 may be directed to the substrate 800. The radiation or particle beams 849a, 849b may alter, for example, the etch properties of first portions 844a of the anti-oxidation liner, whereas the second portions 844b of the anti-oxidation liner remain unaffected. In accordance with further embodiments, the implanted particles may be diffused in neighboring sections such that the doped portions of the anti-oxidation liner reach into the corners between the fin 822 and the first and second substrate portions 828, 829 and adjoin directly to the fin 822.

Referring to FIG. 8B, the first portions 844a of the anti-oxidation liner may then be removed selectively to the second portions 844b to form a conversion mask covering the fin sidewalls and leaving exposed vertical sidewall portions of the first and/or second substrate portions 828, 829. Exposed sections of the semiconductor material may be oxidized, for example, via a heating process in an oxygen containing ambient so as to form spacer structures 824 of a semiconductor oxide, for example, a silicon oxide like silicon dioxide, on the exposed portions of the first and second substrate portions 828, 829. The formation of insulator fences along the fin may be suppressed. In accordance with other embodiments, one or two symmetric radiations or particle beams may be applied in a main plane of incidence perpendicular to the fin and the not-irradiated portions of the anti-oxidation liner may be removed selectively against the irradiated portions to form the conversion mask.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing an integrated circuit including a field effect transistor, the method comprising:
    forming a fin of a semiconductor material, wherein the fin extends between a first and a second substrate portion which face each other on opposing first sides of the fin and wherein two first grooves face each other on opposing second sides of the fin;
    forming a first spacer structure encompassing a first portion of the fin, wherein the first portion directly adjoins to the first substrate portion; and
    forming a gate electrode adjacent to the first spacer structure and encompassing a further portion of the fin,
    wherein forming the fin comprises:
        forming a lamella of the semiconductor material and two insulator structures on opposing sides of the lamella, the lamella comprising the first substrate portion;
        forming a hard mask that covers the first substrate portion and an adjoining first portion of a central lamella portion;
        forming the first grooves in the insulator structures to expose sidewalls of a second portion of the central lamella portion using the hard mask as an etch mask; and
        etching isotropically the semiconductor material to form the fin from the central lamella portion, wherein divots are formed below the hard mask.

2. The method of claim 1, comprising forming an upper edge of the fin below an upper edge of the first and second substrate portions.

3. The method of claim 1, comprising wherein the hard mask further covers portions of the insulator structures adjoining the first substrate portion.

4. The method of claim 1, wherein forming the first spacer structure comprises:
    depositing an insulator material to fill the divots below the hard mask; and
    etching the insulator material to form the first spacer structure from portions of the insulator material below the hard mask.

5. The method of claim 1, after forming the gate electrode, further comprising:
    removing at least hard mask portions above portions of the insulator structures adjoining the first substrate portion; thereafter
    forming second grooves in the insulator structures to expose sidewalls of the first substrate portion; and
    introducing dopants into the first substrate portion through the exposed sidewalls to form a first impurity region in the first substrate portion.

6. The method of claim 5, wherein introducing dopants comprises a diffusion process.

7. The method of claim 5, after forming the first impurity region, further comprising:
    filling the second grooves; thereafter
    forming second sidewall spacers extending along protruding sidewalls of the gate electrode; and
    introducing further dopants into the first substrate portion to form a further impurity region in the first substrate portion.

8. A method of manufacturing an integrated circuit comprising a field effect transistor, the method comprising:
    forming a fin of a semiconductor material, wherein the fin extends between a first and a second substrate portion of the semiconductor material, the first and second substrate portions face each other on opposing first sides of the fin and two first grooves face each other on opposing second sides of the fin;

forming a first spacer structure encompassing a first portion of the fin and a second spacer structure encompassing a second portion of the fin, wherein the first portion directly adjoins to the first substrate portion and the second portion directly adjoins to the second substrate portion; and forming a gate electrode between the first and second spacer structures, wherein forming the fin comprises:

forming a lamella of a semiconductor material and two insulator structures on opposing sides of the lamella;

forming a hard mask that covers the first and second substrate portions and a first and a second portion of a central lamella portion of the lamella;

forming first grooves in the insulator structures to expose sidewalls of a central lamella portion between the first and second portions of the central lamella portion using the hard mask as an etch mask; and etching isotropically the semiconductor material to form the fin from the central lamella portion.

9. The method of claim 8, comprising forming an upper edge of the fin below an upper edge of the first and second substrate portions.

10. The method of claim 8, wherein the hard mask further covers portions of the insulator structures adjoining the first and second substrate portions.

11. The method of claim 8, wherein forming the first and second spacer structures comprises:

depositing an insulator material to fill the grooves in the insulator structures and to fill the divots below the hard mask; and etching the insulator material to form the first and second spacer structures from portions of the insulator material below the hard mask.

12. A method of manufacturing an integrated circuit including an arrangement of field effect transistors, the method comprising:

forming a hard mask that comprises mask lines crossing over parallel active area lines that are arranged in alternating order with line-shaped insulator structures, wherein the mask lines run along a first direction intersecting a second direction along which the active area lines run;

forming first grooves in the insulator structures to expose sidewalls of primary portions of the active area lines;

recessing the primary portions to form divots below the mask lines between recessed portions of the active area lines and the insulator structures; and forming spacer structures in the divots.

13. The method of claim 12, further comprising:

disposing a conductive material between the mask lines and into the first grooves to form gate electrode structures, wherein each gate electrode structure extends between two opposing spacer structures.

14. The method of claim 13, further comprising:

removing at least portions of the mask lines and forming second grooves in the insulator structures between the gate electrode structures to expose sidewalls of secondary portions of the active area lines; and introducing dopants into the secondary portions using a diffusion process to form impurity regions in the second portions.

15. The method of claim 13, comprising forming an upper edge of the recessed portions of the active area lines below an upper edge of non-recessed portions of the active area lines.

* * * * *